United States Patent
Sakata et al.

(10) Patent No.: US 12,355,466 B2
(45) Date of Patent: Jul. 8, 2025

(54) DIGITAL-TO-ANALOG CONVERTER

(71) Applicant: Mitsubishi Electric Corporation, Tokyo (JP)

(72) Inventors: Shuichi Sakata, Tokyo (JP); Kento Saiki, Tokyo (JP); Yuji Komatsuzaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 204 days.

(21) Appl. No.: 18/223,861

(22) Filed: Jul. 19, 2023

(65) Prior Publication Data

US 2023/0361783 A1 Nov. 9, 2023

Related U.S. Application Data

(63) Continuation of application No. PCT/JP2021/010469, filed on Mar. 16, 2021.

(51) Int. Cl.
*H03M 1/66* (2006.01)
*H03M 1/74* (2006.01)

(52) U.S. Cl.
CPC ............. *H03M 1/66* (2013.01); *H03M 1/745* (2013.01)

(58) Field of Classification Search
CPC ................................. H03M 1/66; H03M 1/745
USPC ................................................ 341/141, 144
See application file for complete search history.

(56) References Cited

U.S. PATENT DOCUMENTS

| 6,271,779 B1 * | 8/2001 | Yokomizo ............ H03K 17/162 341/144 |
| 9,484,898 B2 | 11/2016 | Garrec et al. |
| 2016/0087614 A1 | 3/2016 | Garrec et al. |
| 2018/0014123 A1 | 1/2018 | Shajaan et al. |

FOREIGN PATENT DOCUMENTS

| JP | 55-13545 A | 1/1980 |
| JP | 56-147519 A | 11/1981 |
| JP | 2016-524385 A | 8/2016 |
| JP | 6433987 B2 | 12/2018 |

OTHER PUBLICATIONS

International Search Report for PCT/JP2021/010469 (PCT/ISA/210) mailed on May 25, 2021.
Weiss et al., "Integrated 2-b Riemann Pump RF-DAC in GaN Technology for 5G Base Stations", 2019 IEEE/MTT-S International Microwave Symposium (IMS), Boston, MA, Jun. 2-7, 2019, pp. 1426-1429.

* cited by examiner

*Primary Examiner* — Khai M Nguyen
(74) *Attorney, Agent, or Firm* — Birch, Stewart, Kolasch & Birch, LLP

(57) ABSTRACT

A digital-to-analog converter includes a plurality of 1-bit elements each of which outputs a current corresponding to a value indicated by a digital signal when the digital signal is input; and a capacitive load connected to the plurality of 1-bit elements, the digital-to-analog converter being configured to generate an analog voltage waveform via the capacitive load that receives currents output from the plurality of 1-bit elements, wherein each of the 1-bit elements includes a switching circuit to change a bias of a voltage in each of the 1-bit elements according to a value indicated by an input digital signal, and to switch connection and non-connection with a power supply according to a change in the bias.

4 Claims, 3 Drawing Sheets

FIG. 2

| Digital Input Value Pattern | Fourth Bit Current Value $I_4 = 8I_0$ | Third Bit Current Value $I_3 = 4I_0$ | Second Bit Current Value $I_2 = 2I_0$ | First Bit Current Value $I_1 = I_0$ | Total Current |
|---|---|---|---|---|---|
| 1 | 1 | 1 | 1 | 1 | $15 I_0$ |
| 2 | 1 | 1 | 1 | 0 | $13 I_0$ |
| 3 | 1 | 1 | 0 | 1 | $11 I_0$ |
| 4 | 1 | 1 | 0 | 0 | $9 I_0$ |
| 5 | 1 | 0 | 1 | 1 | $7 I_0$ |
| 6 | 1 | 0 | 1 | 0 | $5 I_0$ |
| 7 | 1 | 0 | 0 | 1 | $3 I_0$ |
| 8 | 1 | 0 | 0 | 0 | $1 I_0$ |
| 9 | 0 | 1 | 1 | 1 | $-1 I_0$ |
| 10 | 0 | 1 | 1 | 0 | $-3 I_0$ |
| 11 | 0 | 1 | 0 | 1 | $-5 I_0$ |
| 12 | 0 | 1 | 0 | 0 | $-7 I_0$ |
| 13 | 0 | 0 | 1 | 1 | $-9 I_0$ |
| 14 | 0 | 0 | 1 | 0 | $-11 I_0$ |
| 15 | 0 | 0 | 0 | 1 | $-13 I_0$ |
| 16 | 0 | 0 | 0 | 0 | $-15 I_0$ |

DIGITAL-TO-ANALOG CONVERTER

CROSS REFERENCE TO RELATED APPLICATIONS

This application is a Continuation of PCT International Application No. PCT/JP2021/010469, filed on Mar. 16, 2021, all of which is hereby expressly incorporated by reference into the present application.

TECHNICAL FIELD

The present disclosure relates to a digital-to-analog converter that converts a digital signal into an analog signal.

BACKGROUND ART

Some digital-to-analog converters are configured such that an output load is a capacitor (capacitive load), and a current generator is connected in parallel to the capacitor.

This digital-to-analog converter generates an analog waveform of a voltage in a capacitor by arbitrarily switching between operation and stop of a current generator using a digital signal.

In such a digital-to-analog converter, a driver circuit is generally provided in each current generator in order to switch timing between operation and stop of the current generator.

For example, Non-Patent Literature 1 discloses a digital-to-analog converter in which a current generator includes a transistor, and a driver circuit for driving the transistor is connected to the transistor (see FIG. 3 in Non-Patent Literature 1).

CITATION LIST

Non-Patent Literature

Non-Patent Literature 1: Weiss, M., et. al. "Integrated 2-b Riemann Pump RF-DAC in GaN Technology for 5G Base Stations". 2019 IEEE International microwave symposium (IMS).

SUMMARY OF INVENTION

Technical Problem

In the digital-to-analog converter, a driver circuit and an input terminal for inputting a digital signal to the driver circuit are required for one current generator. In addition, since two current generators are required for one bit, two driver circuits and two input terminals are required for one bit, and there is a problem that the circuit size is large.

In addition, in the digital-to-analog converter described above, in the case of attempting to increase the number of bits, the circuit size increases and the circuit configuration becomes complicated, so that it is difficult to increase the number of bits.

The present disclosure has been made to solve the above problem, and an object of the present disclosure is to provide a digital-to-analog converter having a small circuit size per 1-bit element.

Solution to Problem

A digital-to-analog converter according to the present disclosure comprises: a plurality of 1-bit elements each of which outputs a current corresponding to a value indicated by a digital signal when the digital signal is input; and a capacitive load connected to the plurality of 1-bit elements, the digital-to-analog converter being configured to generate an analog voltage waveform via the capacitive load that receives currents output from the plurality of 1-bit elements, wherein each of the 1-bit elements includes a switching circuit to change a self-bias in each of the 1-bit elements according to a value indicated by an input digital signal, and to switch connection and non-connection with a power supply according to a change in the self-bias, and the switching circuit includes: a current supply switch transistor to switch connection and non-connection with the power supply; a current discharge switch transistor to switch charge or discharge between each of the 1-bit elements and the capacitive load; and a control switch transistor to switch the current supply switch transistor to a non-connection state by discharging the charge from each of the 1-bit elements and the capacitive load according to the value indicated by the input digital signal.

Advantageous Effects of Invention

According to the present disclosure, it is possible to provide a digital-to-analog converter having a small circuit size per bit element.

BRIEF DESCRIPTION OF DRAWINGS

FIG. 2 is a table showing possible patterns of current values in a case where the digital-to-analog converter according to the first embodiment of the present disclosure is configured by four 1-bit elements.

DESCRIPTION OF EMBODIMENTS

In order to explain the present disclosure in more detail, a mode for carrying out the present disclosure will be described below with reference to the accompanying drawings.

First Embodiment

Figure 1:
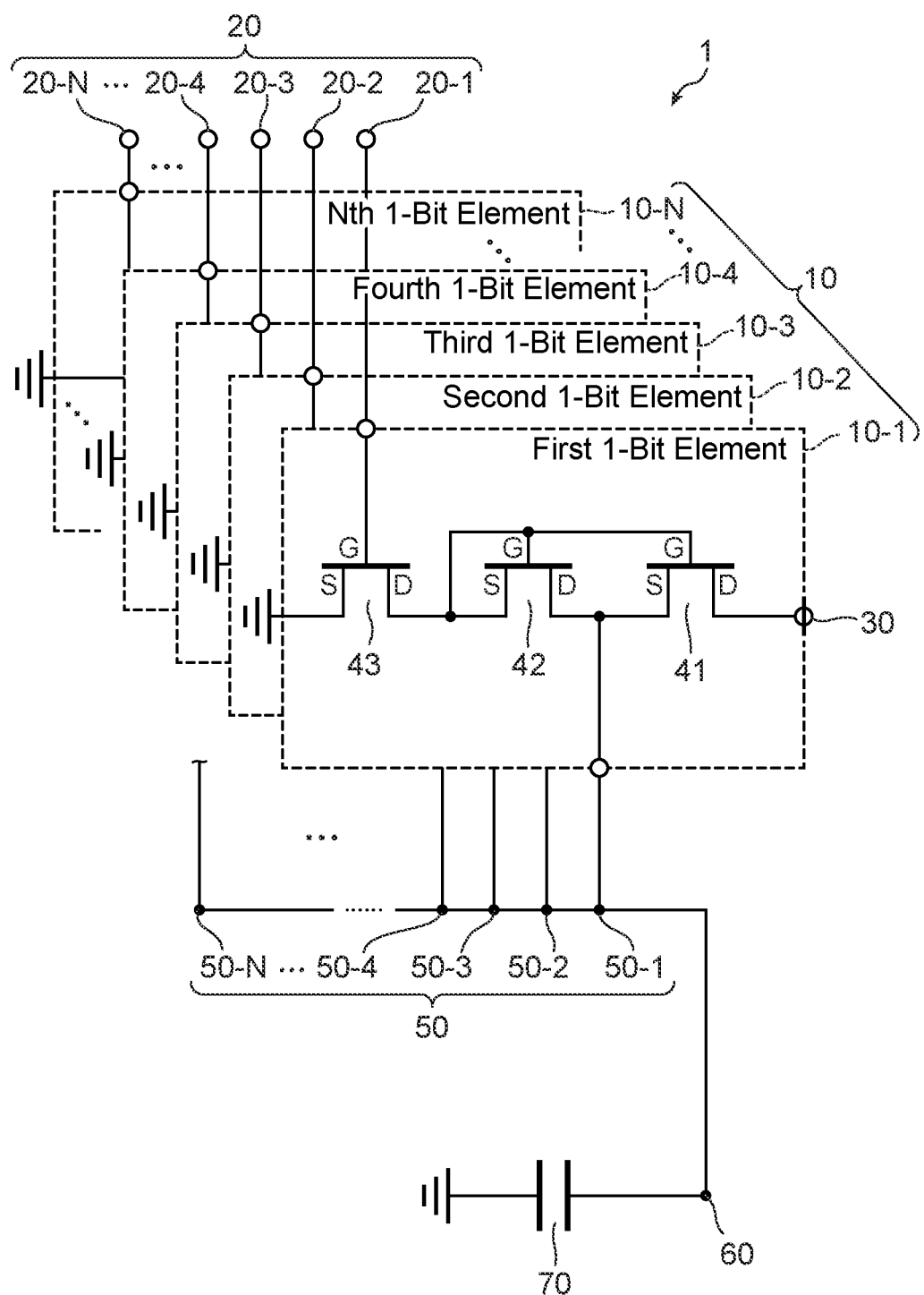
FIG. 1 is a configuration diagram illustrating a digital-to-analog converter according to a first embodiment of the present disclosure.

FIG. 1 is a configuration diagram illustrating a digital-to-analog converter according to a first embodiment of the present disclosure.

A digital-to-analog converter 1 is, for example, a high-frequency digital-to-analog converter.

The digital-to-analog converter 1 includes a plurality of 1-bit elements 10 each outputting a current corresponding to a value indicated by a digital signal when the digital signal is input, and a capacitive load 70 connected to the plurality of 1-bit elements 10.

The value indicated by the digital signal is a voltage value or a value indicating on/off of the switch.

The digital-to-analog converter 1 is configured to generate an analog voltage waveform in the capacitive load 70 that receives the currents output from the plurality of 1-bit elements 10.

The digital-to-analog converter 1 includes a 1-bit element 10, an input terminal 20, a power supply terminal 30, a bit unit output terminal 50, an output terminal 60, and a capacitive load 70.

The 1-bit element 10 illustrated in FIG. 1 includes any number of 1-bit elements 10-1, 10-2, 10-3, 10-4, . . . 10-N.

The number N of the 1-bit elements 10 is any number set in advance according to an analog signal desired to be output by the digital-to-analog converter.

In the description, an nth 1-bit element among the N 1-bit elements will be described as an nth 1-bit element as necessary. n is any number from 1 to N.

Each of the nth 1-bit elements 10-$n$ outputs a current corresponding to a value indicated by a digital signal when the digital signal is input.

Each of the nth 1-bit elements 10-$n$ includes a switching circuit that changes a self-bias in the 1-bit element according to a value indicated by the input digital signal, and switches connection and non-connection with the power supply according to the change in the self-bias.

The switching circuit in the nth 1-bit element 10-$n$ includes, for example, a current supply switch 41, a current discharge switch 42, and a control switch 43 as illustrated in the first 1-bit element 10-1 in FIG. 1.

A detailed example thereof will be described later.

The input terminal 20 is a terminal for inputting a digital signal to each 1-bit element.

The input terminal 20 illustrated in FIG. 1 includes a first input terminal 20-1, a second input terminal 20-2, a third input terminal 20-3, a fourth input terminal 20-4, . . . , and an Nth input terminal 20-N.

The first input terminal 20-1 is provided in the first 1-bit element 10-1. Similarly, the second input terminal 20-2 is provided in the second 1-bit element 10-2, the third input terminal 20-3 is provided in the third 1-bit element 10-3, the fourth input terminal 20-4 is provided in the fourth 1-bit element 10-4, . . . , and the Nth input terminal 20—N is provided in the Nth 1-bit element 10—N.

The power supply terminal 30 is a terminal that is connected to each of the 1-bit elements 10-1, 10-2, 10-3, 10-4, . . . 10-N and is used in common.

The bit unit output terminal 50 is a terminal for outputting a signal from each of the 1-bit elements 10-1, 10-2, 10-3, 10-4, . . . 10-N.

The bit unit output terminal 50 shown in FIG. 1 includes a first bit unit output terminal 50-1, a second bit unit output terminal 50-2, a third bit unit output terminal 50-3, a fourth bit unit output terminal 50-4, . . . , and an Nth bit unit output terminal 50-N.

The first bit unit output terminal 50-1 is provided in the first 1-bit element 10-1. Similarly, the second bit unit output terminal 50-2 is provided in the second 1-bit element 10-2, the third bit unit output terminal 50-3 is provided in the third 1-bit element 10-3, the fourth bit unit output terminal 50-4 is provided in the fourth 1-bit element 10-4, . . . , and the Nth bit unit output terminal 50-N is provided in the Nth 1-bit element 10-N.

The output terminal 60 is a terminal that connects the bit unit output terminals 50-1, 50-2, 50-3, 50-4, . . . , and 50-N of the respective 1-bit elements 10-1, 10-2, 10-3, 10-4, . . . , and 10-N in parallel.

Further, the output terminal 60 is connected to the capacitive load 70.

That is, the output terminal 60 connects each of the 1-bit elements 10-1, 10-2, 10-3, 10-4, . . . , and 10-N and the capacitive load 70.

One end of the capacitive load 70 is connected to each of the 1-bit elements 10-1, 10-2, 10-3, 10-4, . . . , and 10-N via the output terminal 60, and the other end is grounded.

A detailed example of the nth 1-bit element 10-$n$ will be described.

In FIG. 1, the current supply switch 41 in the switching circuit of the nth 1-bit element 10-$n$ is, for example, an N-type and normally-on type transistor (current supply switch transistor).

In the case of a normally-on type transistor, the current supply switch 41 is a transistor that performs switching so that a current flows from the drain terminal D to the source terminal S in a state where a voltage of 0 V or more is applied to the gate terminal G, and a current does not flow from the drain terminal D to the source terminal S when a voltage having a negative gate-source potential is applied to the gate terminal G.

The current supply switch 41 switches connection and non-connection with the power supply terminal 30, allows a current to flow from the power supply terminal 30 in the connected state, and does not allow a current to flow from the power supply terminal 30 in the non-connection state.

Similarly, the current discharge switch 42 in the switching circuit of the nth 1-bit element 10-$n$ is, for example, an N-type and normally-on type transistor (current discharge switch transistor).

In the case of a normally-on type transistor, the current discharge switch 42 is a transistor that performs switching so that a current flows from the drain terminal D to the source terminal S in a state where a voltage of 0 V or more is applied to the gate terminal G, and when a voltage having a negative gate-source potential is applied to the gate terminal G, a current does not flow from the drain terminal D to the source terminal S.

The current discharge switch 42 switches charge or discharge between the 1-bit element 10-$n$ and the capacitive load 70.

Similarly, the control switch 43 in the switching circuit of the nth 1-bit element 10-$n$ is, for example, an N-type and normally-on type transistor (control switch transistor).

In the case of a normally-on type transistor, the control switch 43 is a transistor that performs switching so that a current flows from the drain terminal D to the source terminal S in a state where a voltage of 0 V or more is applied to the gate terminal G, and when a voltage having a negative gate-source potential is applied to the gate terminal G, a current does not flow from the drain terminal D to the source terminal S.

The control switch 43 switches the current supply switch transistor to the non-connection state by discharging the charge from each of the 1-bit element 10-$n$ and the capacitive load 70 according to the value indicated by the input digital signal.

The size of the transistor of the control switch 43 is designed to be sufficiently larger than the size of the transistor of the current supply switch 41 and the size of the transistor of the current discharge switch 42. In other words, the control switch 43 allows a current to flow more easily than the current supply switch 41 and the current discharge switch 42.

In the nth 1-bit element 10-$n$, as illustrated in the first 1-bit element 10-1 of FIG. 1, the source terminal S of the current supply switch 41 (current supply switch transistor) and the drain terminal D of the current discharge switch 42 (current discharge switch transistor) are connected.

Further, in the nth 1-bit element 10-$n$, the source terminal S of the current discharge switch 42 (current discharge switch transistor) and the drain terminal D of the control switch 43 (control switch transistor) are connected.

Further, in the nth 1-bit element 10-n, the gate terminal G of the current supply switch 41 (current supply switch transistor), the gate terminal G of the current discharge switch 42 (current discharge switch transistor), and the source terminal S of the current discharge switch 42 (current discharge switch transistor) are connected.

Further, in the nth 1-bit element 10-n, the drain terminal D and the power supply terminal of the current supply switch 41 (current supply switch transistor) are connected.

Furthermore, in the nth 1-bit element 10-n, the source terminal S of the current supply switch 41 (current supply switch transistor) and the drain terminal D of the current discharge switch 42 (current discharge switch transistor) are connected to the nth bit unit output terminal 50-n and the output terminal 60.

In addition, in the nth 1-bit element 10-n, the source terminal S of the control switch 43 (control switch transistor) is grounded.

Furthermore, in the nth 1-bit element 10-n, the gate terminal G of the control switch 43 (control switch transistor) and the nth input terminal 20-n are connected.

Next, the operation of the digital-to-analog converter 1 will be described.

When a digital signal is input from the input terminal 20-n, the nth 1-bit element 10-n charges a current at the output terminal 60 in a case where the digital signal indicates low voltage or off.

On the other hand, the nth 1-bit element 10-n discharges a current from the output terminal 60 in a case where the digital signal indicates a high voltage or on.

The charge and discharge current values can be determined by the sizes of the transistors constituting the current supply switch 41 and the current discharge switch 42.

Specifically, the charge current value is determined by the size of the current supply switch transistor constituting the current supply switch 41. Further, the discharge current value is determined by the size of the current discharge switch transistor constituting the current discharge switch 42.

Although it is possible to make the size of the current supply switch transistor and the size of the current discharge switch transistor non-identical, the same case will be described in the description.

When the current supply amount from each of the 1-bit elements 10-1, 10-2, 10-3, 10-4, . . . , and 10-N in the 1-bit element 10 exceeds the current discharge amount, the voltage value at the output terminal 60 increases.

When the current supply amount from each of the 1-bit elements 10-1, 10-2, 10-3, 10-4, . . . , and 10-N in the 1-bit element 10 falls below the current discharge amount, the voltage value at the output terminal 60 decreases.

Here, when the current values from the 1-bit elements 10-1, 10-2, 10-3, 10-4, . . . , 10-n, . . . , and 10-N are denoted by I1, I2, I3, . . . , In, . . . , and IN, the voltage value Vout appearing at the output terminal 60 is expressed by the following formula in a case where the capacitive load 70 is Cout and the time is "t".

$$V_{out} = \frac{1}{C_{out}} \int_0^t \left( \sum_{i=1}^N I_i \right) dt \qquad (1)$$

When Formula (1) is differentiated, it is found that a value obtained by dividing the sum of the current values by the load capacitance Cout is the time derivative or slope of the voltage.

Therefore, by making the current values from the 1-bit elements 10-1, 10-2, 10-3, 10-4, . . . , 10-n, . . . , and 10-N different from each other, it is possible to create Nth power of 2 different current values, and accordingly, it is possible to create a time derivative or a slope of Nth power of 2 different voltages.

As an example of setting the current value of each bit, there is the following method.

The current value $I_n$ from the nth 1-bit element is set to the current value of the following Formula (2).

$$I_n = 2^{n-1} I_0 \qquad (2)$$

Here, $I_0$ is any current value. The digital input value of an nth bit is $D_n$, $D_n=1$ in the case of ON, and $D_n=0$ in the case of OFF. A current value $I_{out}$ flowing to the output terminal is expressed by the following Formula (3).

$$I_{out} = \sum_{n=1}^N (-1)^{D_n} \cdot 2^{n-1} \cdot I_0 \qquad (3)$$

By setting as in Formula (3), it is possible to create a value in which the current value is different by $2I_0$ in the current value from $(2^N-1) I_0$ to $-(2^N-1) I_0$.

FIG. 2 is a table showing possible patterns of current values in a case where the digital-to-analog converter according to the first embodiment of the present disclosure includes four 1-bit elements.

As shown in the table, it is found that it is possible to create a value in which the current value is different by $2 I_0$ from $15 I_0$ to $-15 I_0$.

As described above, since a plurality of current values can be created in a finite manner, any voltage waveform can be created by the digital signal according to Formula (1). Specifically, a desired analog voltage waveform can be generated by inputting a digital signal corresponding to a value obtained by time-differentiating a desired analog voltage waveform.

Next, the operation of the 1-bit element 10 will be described.

Figure 3:
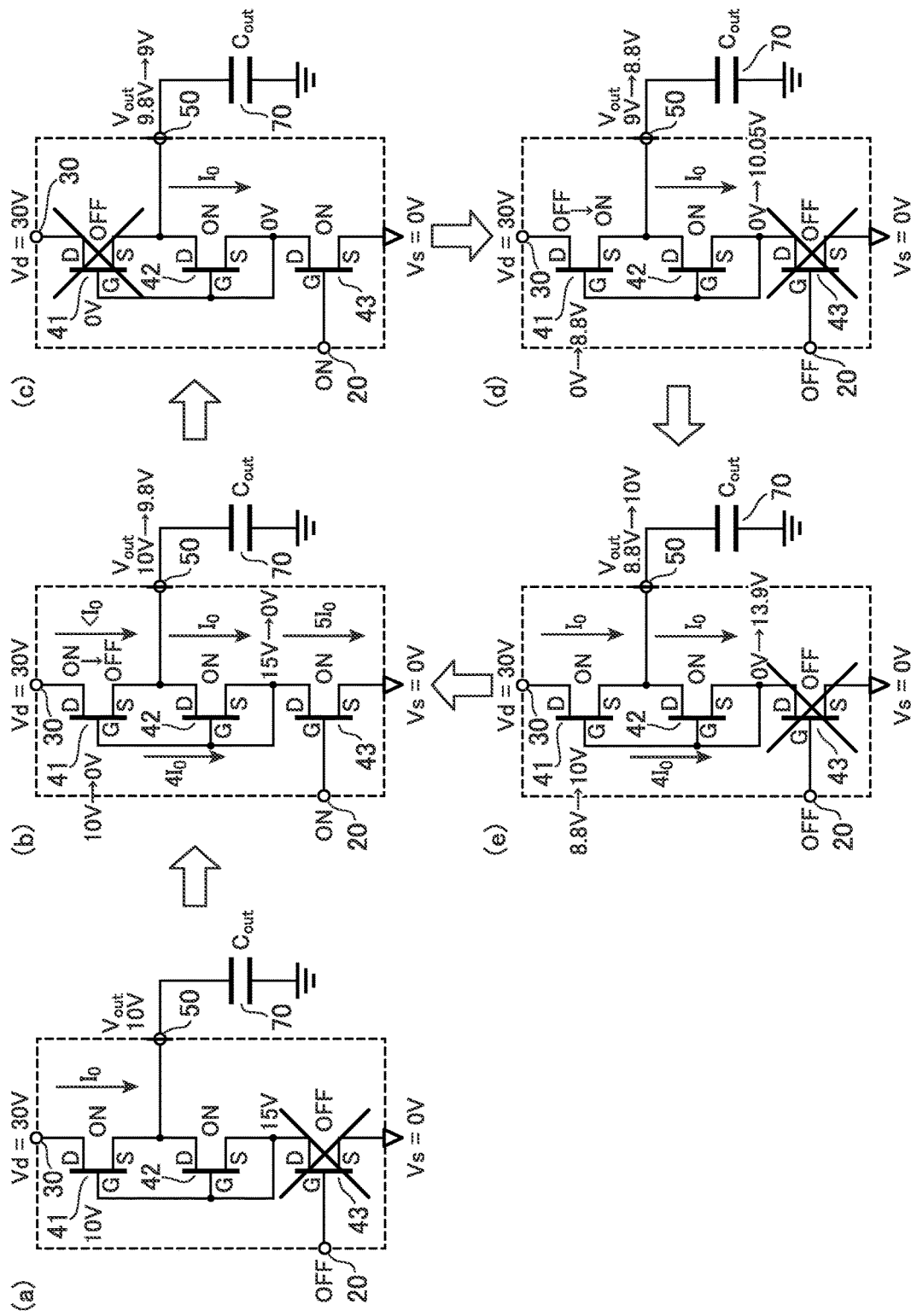
FIG. 3 is a diagram for explaining the operation of the 1-bit elements of the digital-to-analog converter according to the first embodiment of the present disclosure.

FIG. 3 is a diagram for explaining the operation of the 1-bit elements 10 of the digital-to-analog converter 1 according to the first embodiment of the present disclosure. In FIG. 3, parts (a), (b), (c), (d), and (e) each indicate time changes due to on and off of the control switch 43 in the nth 1-bit element 10-n. Hereinafter, in the description, these parts are each described as FIGS. 3(a), 3(b), 3(c), 3(d), and 3(e).

In the description, a case where the power supply voltage $V_d$ is 30 V will be described.

In addition, in the description, N-type and normally-on type transistors are used as the current supply switch 41, the current discharge switch 42, and the control switch 43.

FIG. 3(a) illustrates a state of the nth 1-bit element 10-n immediately before the control switch 43 is turned on.

In the state illustrated in FIG. 3(a), the voltage value Vout appearing at the bit unit output terminal 50 of the nth 1-bit element 10-n is 10 V.

In addition, in the state illustrated in FIG. 3(a), the current discharge switch 42 is normally on and a current flows therethrough, and the voltage at each of the gate terminal G of the current supply switch 41, the gate terminal G of the current discharge switch 42, and the source terminal S of the current discharge switch 42 is 10 V. As a result, the voltage between these and the drain terminal D of the control switch 43 is 15 V. In addition, the voltage value $V_{out}$ appearing at the bit unit output terminal 50 is 10 V.

FIG. 3(*b*) illustrates a state immediately after the control switch 43 is turned on from the state of FIG. 3(*a*).

When the control switch 43 is turned on, all the switches (current supply switch 41, current discharge switch 42, and control switch 43) are turned on, so that a current flows to the ground (Vs=0 V) via the control switch 43 ("$4I_0$", "<$I_0$" ("<$I_0$" indicates that the value gradually decreases from $I_0$ to zero.), "$I_0$", and "$5I_0$" in FIG. 3(*b*)). Further, the voltage applied to the gate terminal G of the current supply switch 41, the gate terminal G of the current discharge switch 42, and the source terminal S of the current discharge switch 42 changes from 10 V to 0 V. In addition, the voltage value $V_{out}$ appearing at the bit unit output terminal 50 changes from 10 V to 9.8 V.

At this time, the current flowing through the control switch 43 can be divided into three components. The currents of the three components are the following (current component 1), (current component 2), and (current component 3).

(Current component 1) Current (hereinafter, referred to as a "first current") from the power supply terminal 30 via the current supply switch 41, the current discharge switch 42, and the control switch 43.

(Current component 2) Current (hereinafter, referred to as a "second current") from the bit unit output terminal 50 via the current discharge switch 42 and the control switch 43.

(Current component 3) Current (hereinafter, referred to as a "third current") from a line connecting the gate terminal G of the current supply switch 41 and the gate terminal G of the current discharge switch 42 via only the control switch 43.

Since the transistor size of the control switch 43 is designed to be sufficiently larger than the transistor size of the current discharge switch 42 and the transistor size of the current supply switch 41, the third current value ($4I_0$) is the largest, and the first current value and the second current value are sufficiently smaller than the third current value.

The current source of the third current is charges accumulated at the gate end of the current supply switch 41 and the gate end of the current discharge switch 42.

Since this is discharged by the third current, the potentials of the gate end of the current supply switch 41 and the gate end of the current discharge switch 42 drop sharply. As the potential drops sharply, the voltage between the gate and the source of the current supply switch 41 becomes largely negative.

In this way, the current supply switch 41 is switched from on to off (ON→OFF) by the change in the self-bias of the nth 1-bit element 10-*n*. Then, the state illustrated in FIG. 3(*c*) is obtained (OFF).

Next, since the current supply switch 41 is turned off, the current path from the power supply terminal 30 to the ground (Vs=0 V) is closed. As a result, the potential accumulated in the bit unit output terminal 50 (and the output terminal 60) is discharged via the current discharge switch 42, and the potential falls at a desired slope ($V_{out}$ 9.8 V→9 V).

Next, the control switch 43 is turned off by the digital signal input to the nth 1-bit element 10-*n*.

FIG. 3(*d*) illustrates a state immediately after the control switch 43 is turned off from the state of FIG. 3(*c*).

First, a current due to the potential accumulated in the bit unit output terminal 50 flows through the current discharge switch 42.

Here, since the control switch 43 is turned off in the nth 1-bit element 10-*n*, the current flowing through the current discharge switch 42 is used for charging (0 V→8.8 V) at the gate terminal G of the current supply switch 41 and the gate terminal G of the current discharge switch 42.

Then, the current supply switch 41 is thereby switched from off to on (OFF→ON) by a change in the self-bias of the nth 1-bit element 10-*n*.

FIG. 3(*e*) illustrates a state in which the current supply switch 41 is switched on.

In the nth 1-bit element 10-*n*, since the current supply switch 41 is turned on, the bit unit output terminal 50 is charged via the current supply switch 41, and the potential at the bit unit output terminal 50 rises at a desired slope (8.8 V→10 V).

Next, when the control switch 43 is switched on, the state returns from the state of FIG. 3(*e*) to the state of FIG. 3(*b*).

By operating as described above, in each of the 1-bit elements 10-1, 10-2, 10-3, 10-4, . . . , 10-*n*, . . . , and 10-N of the digital-to-analog converter 1, the self-bias is changed according to the digital signal from one input terminal to control the voltage applied to the gate terminal G of the current supply switch 41 and the gate terminal G of the current discharge switch 42, the current supply switch 41 and the current discharge switch 42 can be switched, the potential of the bit unit output terminal 50 can be changed, and a circuit operating with one input terminal can be implemented without providing a driver circuit.

The digital-to-analog converter according to the first embodiment of the present disclosure includes a plurality of 1-bit elements each of which outputs a current corresponding to a value indicated by a digital signal when the digital signal is input; and a capacitive load connected to the plurality of 1-bit elements, the digital-to-analog converter being configured to generate an analog voltage waveform via the capacitive load that receives currents output from the plurality of 1-bit elements, wherein each of the 1-bit elements includes a switching circuit to change a bias of a voltage in each of the 1-bit elements according to a value indicated by an input digital signal, and to switch connection and non-connection with a power supply according to a change in the bias.

As a result, it is possible to provide a digital-to-analog converter having a small circuit size per 1-bit element.

In addition, since the circuit size per 1-bit element is small, it is easy to increase the number of bits.

In the digital-to-analog converter according to the first embodiment of the present disclosure, the switching circuit includes: a current supply switch transistor to switch connection and non-connection with the power supply; a current discharge switch transistor to switch charge or discharge between each of the 1-bit elements and the capacitive load; and a control switch transistor to switch the current supply switch transistor to a non-connection state by discharging the charge from each of the 1-bit elements and the capacitive load according to the value indicated by the input digital signal.

As a result, it is possible to provide a digital-to-analog converter that achieves the same effect as the above effect.

The digital-to-analog converter according to the first embodiment of the present disclosure is configured in such a manner that a source terminal of the current supply switch transistor and a drain terminal of the current discharge switch transistor are connected to each other, a source terminal of the current discharge switch transistor and a drain terminal of the control switch transistor are connected to each other, a gate terminal of the current supply switch transistor, a gate terminal of the current discharge switch transistor, and a source terminal of the current discharge switch transistor are connected to each other, a drain terminal of the current supply switch transistor is connected to a power supply terminal, a source terminal of the current supply switch transistor and a drain terminal of the current discharge switch transistor are connected to an output terminal, a source terminal of the control switch transistor is grounded, and a gate terminal of the control switch transistor is connected to an input terminal thereof.

As a result, it is possible to provide a digital-to-analog converter that achieves the same effect as the above effect without complicating the circuit configuration.

The digital-to-analog converter according to the first embodiment of the present disclosure is configured in such a manner that each of the current supply switch transistor, the current discharge switch transistor, and the control switch transistor is a transistor that performs switching so that a current does not flow between a drain terminal and a source terminal when a voltage having a negative gate-source potential is applied to a gate terminal.

As a result, it is possible to provide a digital-to-analog converter having a simpler configuration and exhibiting the same effect as the above effect.

Note that, in the present disclosure, it is possible to modify any component of the embodiment or omit any component of the embodiment within the scope of the disclosure.

INDUSTRIAL APPLICABILITY

Since the digital-to-analog converter according to the present disclosure can be configured to have a small circuit size per 1-bit element, the digital-to-analog converter is suitable for use in, for example, a high-frequency digital-to-analog converter, a communication device including a high-frequency digital-to-analog converter, or the like.

REFERENCE SIGNS LIST

1: Digital-to-analog converter, 10: 1-bit element, 10—1: First 1-bit element, 10—2: Second 1-bit element, 10—3: Third 1-bit element, 10—4: Fourth 1-bit element, 10—N: Nth 1-bit element, 20: Input terminal, 20—1: First input terminal, 20—2: Second input terminal, 20—3: Third input terminal, 20—4: Fourth input terminal, 20—N: Nth input terminal, 30: Power supply terminal, 41: Current supply switch, 42: Current discharge switch, 43: Control switch, 50: Bit unit output terminal, 50—1: First bit unit output terminal, 50—2: Second bit unit output terminal, 50—3: Third bit unit output terminal, 50—4: Fourth bit unit output terminal, 50—N: Nth bit unit output terminal, 60: Output terminal, 70: Capacitive load

The invention claimed is:

1. A digital-to-analog converter comprising: a plurality of 1-bit elements each of which outputs a current corresponding to a value indicated by a digital signal when the digital signal is input; and a capacitive load connected to the plurality of 1-bit elements, the digital-to-analog converter being configured to generate an analog voltage waveform via the capacitive load that receives currents output from the plurality of 1-bit elements, wherein
  each of the 1-bit elements includes a switching circuit to change a bias of a voltage in each of the 1-bit elements according to a value indicated by an input digital signal, and to switch connection and non-connection with a power supply according to a change in the bias, and
  the switching circuit includes:
    a current supply switch transistor to switch connection and non-connection with the power supply;
    a current discharge switch transistor to switch charge or discharge between each of the 1-bit elements and the capacitive load; and
    a control switch transistor to switch the current supply switch transistor to a non-connection state by discharging the charge from each of the 1-bit elements and the capacitive load according to the value indicated by the input digital signal.

2. The digital-to-analog converter according to claim 1, wherein
  a source terminal of the current supply switch transistor and a drain terminal of the current discharge switch transistor are connected to each other,
  a source terminal of the current discharge switch transistor and a drain terminal of the control switch transistor are connected to each other,
  a gate terminal of the current supply switch transistor, a gate terminal of the current discharge switch transistor, and a source terminal of the current discharge switch transistor are connected to each other,
  a drain terminal of the current supply switch transistor is connected to a power supply terminal,
  a source terminal of the current supply switch transistor and a drain terminal of the current discharge switch transistor are connected to an output terminal,
  a source terminal of the control switch transistor is grounded, and
  a gate terminal of the control switch transistor is connected to an input terminal.

3. The digital-to-analog converter according to claim 1, wherein
  each of the current supply switch transistor, the current discharge switch transistor, and the control switch transistor is a transistor that performs switching so that a current does not flow between a drain terminal and a source terminal when a voltage having a negative gate-source potential is applied to a gate terminal thereof.

4. The digital-to-analog converter according to claim 2, wherein
  each of the current supply switch transistor, the current discharge switch transistor, and the control switch transistor is a transistor that performs switching so that a current does not flow between a drain terminal and a source terminal when a voltage having a negative gate-source potential is applied to a gate terminal thereof.

* * * * *